US012618142B2

(12) United States Patent
Hatano et al.

(10) Patent No.:  US 12,618,142 B2
(45) Date of Patent:      May 5, 2026

(54) SUBSTRATE PROCESSING APPARATUS AND SUBSTRATE PROCESSING METHOD

(71) Applicant: Tokyo Electron Limited, Tokyo (JP)

(72) Inventors: Tatsuo Hatano, Yamanashi (JP); Naoki Watanabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/074,261

(22) Filed: Dec. 2, 2022

(65) Prior Publication Data

US 2023/0183854 A1     Jun. 15, 2023

(30) Foreign Application Priority Data

Dec. 14, 2021    (JP) ................................. 2021-202854

(51) Int. Cl.
| | |
|---|---|
| *C23C 14/34* | (2006.01) |
| *C23C 14/35* | (2006.01) |
| *C23C 14/50* | (2006.01) |
| *H01J 37/32* | (2006.01) |
| *H01J 37/34* | (2006.01) |
| *H10P 14/20* | (2026.01) |
| *H10P 14/22* | (2026.01) |
| *H10P 72/72* | (2026.01) |
| *H10P 72/76* | (2026.01) |

(Continued)

(52) U.S. Cl.
CPC .......... *C23C 14/3428* (2013.01); *C23C 14/35* (2013.01); *C23C 14/505* (2013.01); *H01J 37/3244* (2013.01); *H01J 37/32724* (2013.01); *H01J 37/3426* (2013.01); *H10P 14/22*

(2026.01); *H10P 14/3216* (2026.01); *H10P 14/3416* (2026.01); *H10P 72/72* (2026.01); *H10P 72/7618* (2026.01); *H01J 2237/002* (2013.01); *H01J 2237/2007* (2013.01); *H01J 2237/20214* (2013.01); *H01J 2237/332* (2013.01)

(58) Field of Classification Search
CPC .... C23C 14/50; C23C 14/505; C23C 14/3428
See application file for complete search history.

(56) References Cited

U.S. PATENT DOCUMENTS

| | | | | |
|---|---|---|---|---|
| 5,507,931 | A | * | 4/1996 | Yang ................... H01J 37/3414 |
| | | | | 204/192.15 |
| 2007/0114122 | A1 | * | 5/2007 | Ishibashi ............. C23C 14/0617 |
| | | | | 204/192.1 |

(Continued)

FOREIGN PATENT DOCUMENTS

| | | | | |
|---|---|---|---|---|
| DE | 4211798 A1 | * | 10/1993 | ............. C23C 14/35 |
| JP | 4979442 B2 | | 7/2012 | |

OTHER PUBLICATIONS

Translation to Reineck (DE 42 11 798) published Oct. 1993.*

*Primary Examiner* — John J Brayton
(74) *Attorney, Agent, or Firm* — Venjuris, P.C.

(57) ABSTRACT

A substrate processing apparatus includes: a tray provided in a vacuum processing container and having a recess that accommodates a target made of a low-melting-point material; a refrigerator that cools the tray; a substrate holder that holds a substrate; a reversal driver that reverses the position of the substrate holder upside down; and a rotation driver that rotates the substrate holder in a circumferential direction of the substrate.

15 Claims, 4 Drawing Sheets

(51) Int. Cl.
   *H01L 21/02*          (2006.01)
   *H01L 21/683*         (2006.01)
   *H01L 21/687*         (2006.01)

(56)                    References Cited

U.S. PATENT DOCUMENTS

| | | | |
|---|---|---|---|
| 2010/0055296 A1* | 3/2010 | Bankmann | C23C 14/505 |
| | | | 118/712 |
| 2012/0164354 A1* | 6/2012 | Otani | C23C 14/185 |
| | | | 427/580 |
| 2021/0381099 A1* | 12/2021 | Jaeger | H01J 37/3432 |

\* cited by examiner

*FIG. 3A*          *FIG. 3B*
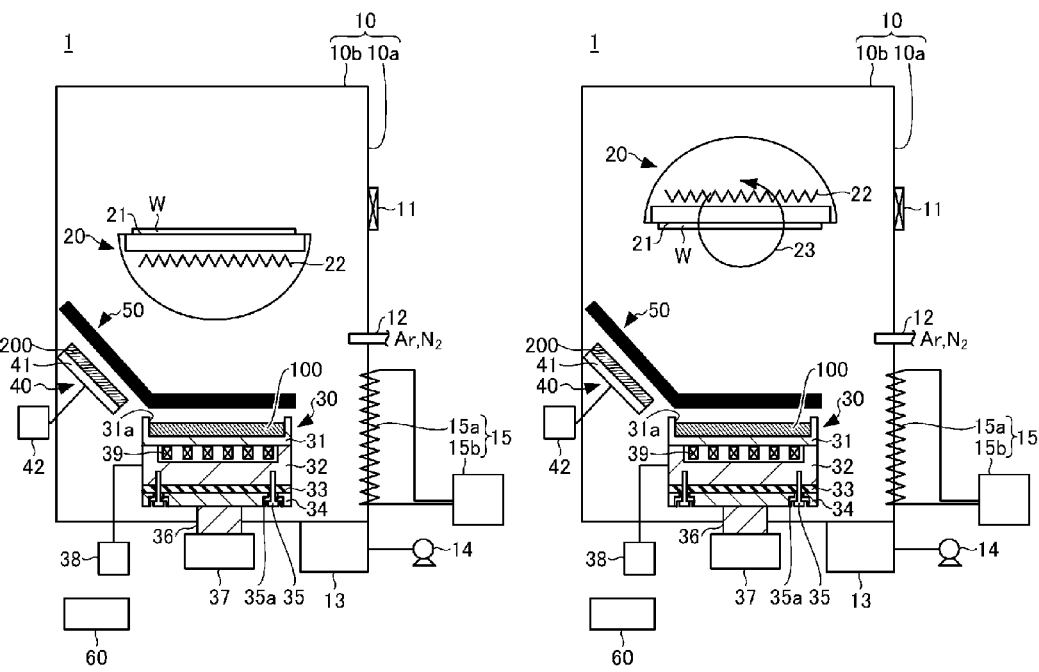
*FIG. 3C*          *FIG. 3D*
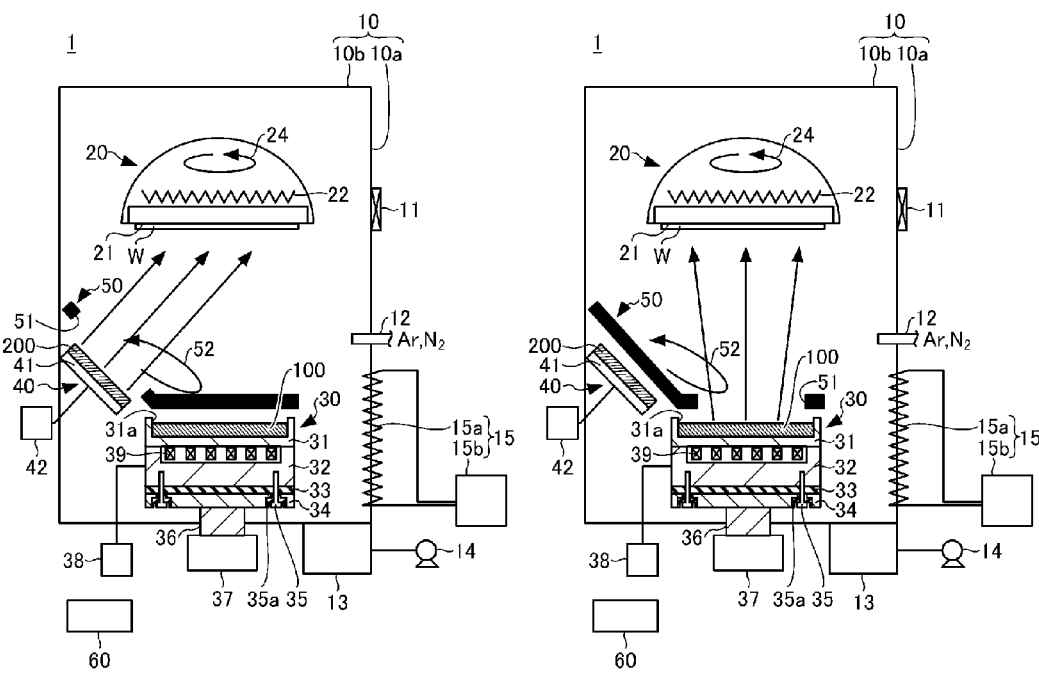

SUBSTRATE PROCESSING APPARATUS AND SUBSTRATE PROCESSING METHOD

CROSS-REFERENCE TO RELATED APPLICATIONS

The present application is based on and claims priority from Japanese Patent Application No. 2021-202854, filed on Dec. 14, 2021, with the Japan Patent Office, the disclosure of which is incorporated herein in its entirety by reference.

TECHNICAL FIELD

The present disclosure relates to a substrate processing apparatus and a substrate processing method.

BACKGROUND

Japanese Patent No. 4979442 discloses a method of manufacturing a Ga sputtering target by pouring Ga or Ga alloy in a liquid state into a backing plate to obtain a Ga-holding backing plate, then, heat-treating the Ga-holding backing plate in a reduced pressure state or a hydrogen gas atmosphere, and then, cooling the Ga-holding backing plate until the Ga or Ga alloy becomes a solid state.

SUMMARY

According to an aspect of the present disclosure, a substrate processing apparatus including: a tray provided in a vacuum processing container and having a recess that accommodates a target made of a low-melting-point material; a refrigerator that cools the tray; a substrate holder that holds a substrate; a reversal driver that reverses a position of the substrate holder upside down; and a rotation driver that rotates the substrate holder in a circumferential direction of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3D are views illustrating an example of a film forming process using the substrate processing apparatus.

DETAILED DESCRIPTION

Figure 1:
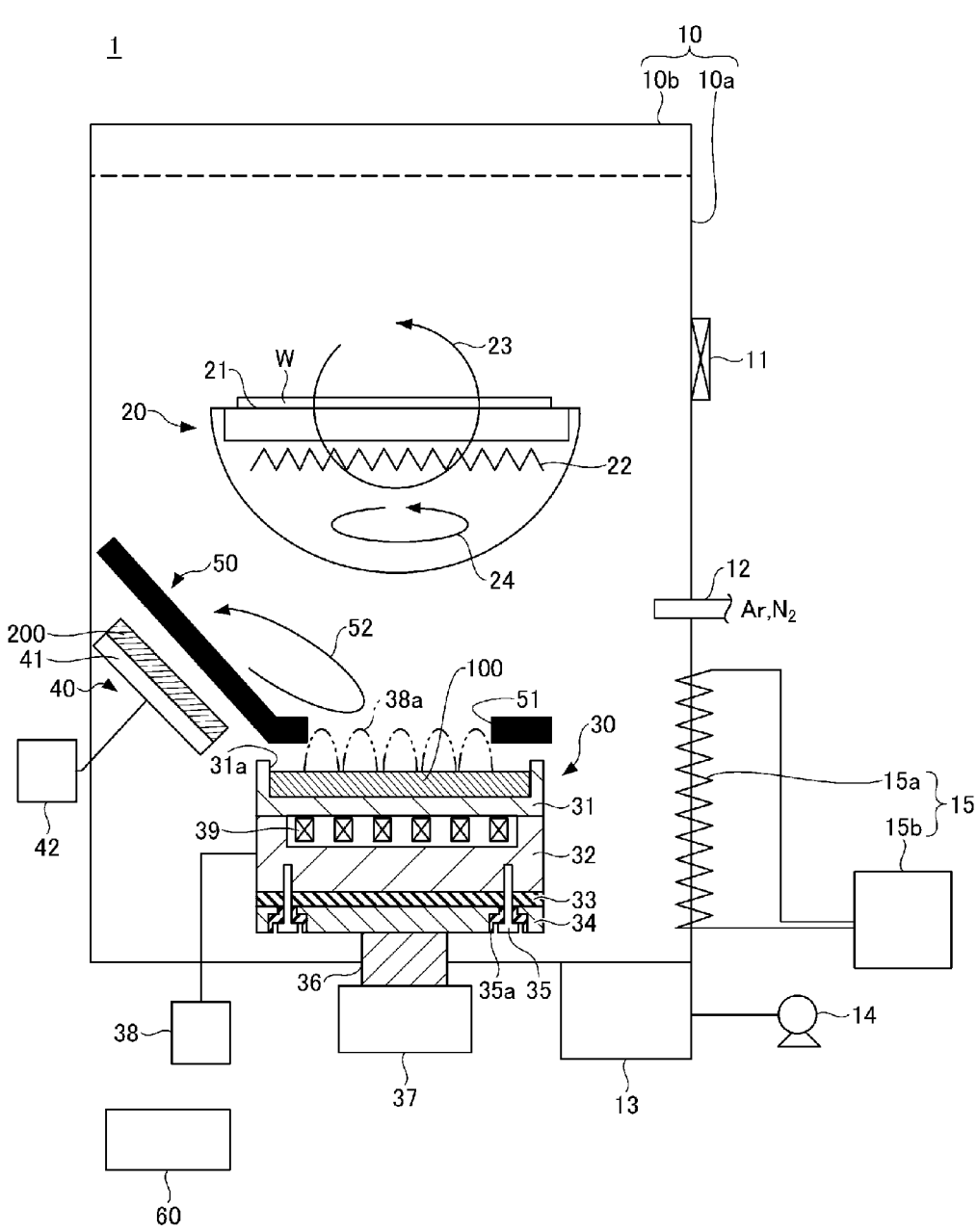
FIG. 1 is an example of a cross-sectional view illustrating a configuration of a substrate processing apparatus.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components may be denoted by the same reference numerals, and overlapping descriptions thereof may be omitted.

(Substrate Processing Apparatus 1)

A substrate processing apparatus 1 will be described with reference to FIG. 1. FIG. 1 is an example of a cross-sectional view illustrating a configuration of the substrate processing apparatus 1.

The substrate processing apparatus 1 includes a processing chamber 10, a substrate holding unit 20, sputtered particle emitting units 30 and 40, a shielding plate 50, and a control unit 60. The substrate processing apparatus 1 is, for example, a physical vapor deposition (PVD) apparatus, and is a sputtering apparatus which forms a film by adhering sputtered particles (film formation atoms) emitted from the sputtered particle emitting units 30 and 40 to the surface of a substrate W such as a semiconductor wafer held by the substrate holding unit 20, in the processing chamber 10.

The processing chamber 10 includes a chamber main body 10a with an upper opening, and a lid 10b provided to close the upper opening of the chamber main body 10a. The inside of the processing chamber 10 serves as a processing space S in which a film forming process is performed. The lid 10b is detachably provided.

A carry in/out port is formed in the side wall of the processing chamber 10 to carry the substrate W in/out. The carry in/out port is opened and closed by a gate valve 11.

A gas introduction port 12 is provided in the side wall of the processing chamber 10 to introduce a gas into the processing space S. A gas supply (not illustrated) is connected to the gas introduction port 12. A sputtering gas (e.g., an inert gas or Ar gas) is introduced into the gas introduction port 12 from the gas supply to sputter a target 100. Further, a reactive gas (e.g., $N_2$ gas) is introduced into the gas introduction port 12 from the gas supply to react with the sputtered particles adhering to the surface of the substrate W.

An exhaust port 13 is formed in the bottom portion of the processing chamber 10. An exhaust device 14 is connected to the exhaust port 13. The exhaust device 14 includes a pressure control valve and a vacuum pump. The processing space S is evacuated to a predetermined degree of vacuum by the exhaust device 14.

The side wall of the processing chamber 10 is provided with a cooling mechanism 15 that cools the processing chamber 10. The cooling mechanism 15 includes a coolant flow path 15a provided in the side wall of the processing chamber 10, and a circulation device 15b that circulates the coolant in the coolant flow path 15a.

The substrate holding unit 20 includes an electrostatic chuck 21 and a heater 22.

The electrostatic chuck 21 holds the substrate W by electrostatically adsorbing the substrate W thereonto.

The heater 22 heats the substrate W held by the substrate holding unit 20. For example, the heater 22 is able to heat the substrate W to 500° C. to 600° C.

The substrate processing apparatus 1 further includes a reversal driver (not illustrated) that rotates the substrate holding unit 20 in a rotation direction 23 with the horizontal direction as a rotation axis, thereby reversing the substrate holding unit 20 upside down.

The substrate processing apparatus 1 further includes a rotation driver (not illustrated) that rotates the substrate holding unit 20 in a rotation direction 24 with the vertical direction as a rotation axis, thereby rotating the substrate holding unit 20 in the circumferential direction of the substrate W held by the substrate holding unit 20.

The sputtered particle emitting unit 30 includes a tray 31 that holds the target 100, a tray support 32, an insulator 33, a heat transfer member 34, fastening bolts 35, a shaft 36, a refrigerator 37, and a magnet 39, and a power supply 38.

The target 100 is made of a material containing constituent elements of a film to be formed, and may be a conductive material or a dielectric material. Here, the target 100 of the sputtered particle emitting unit 30 is a low-melting-point material that is liquefied from a solid due to a temperature rise caused from a collision of Ar ions when a sputtering is performed by colliding the Ar ions with the target 100 of room temperature.

Descriptions will be made herein below assuming that the target 100 is Ga (melting point: 29.76° C.). The low-melting-point material is not limited thereto, and a material having a melting point of −50° C. or higher and 200° C. or lower may be used.

The tray 31 has a recess 31a, and is configured to hold a liquid or the solid target 100 in the recess 31a. The tray 31 is made of a nonmagnetic, electrically conductive, and highly thermally conductive material (e.g., Cu).

Figure 2:
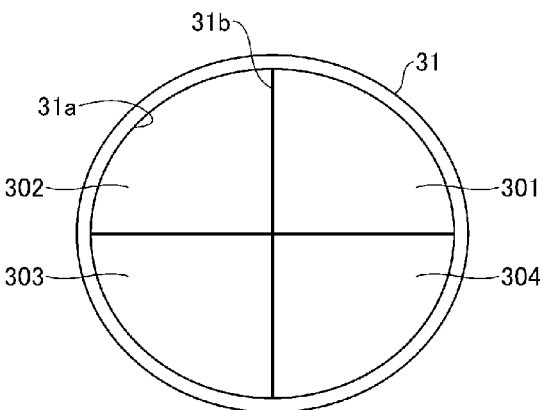
FIG. 2 is an example of a tray when viewed from above.

Here, the tray 31 will be further described with reference to FIG. 2. FIG. 2 is an example of the tray 31 when viewed from above.

Here, cracks may occur on the surface of the target 100 due to a change in volume when the target 100 changes from liquid to solid. When cracks occur on the surface of the target 100, an electric field concentration may occur, and thus, an abnormal discharge may occur.

Thus, as illustrated in FIG. 2, a partition 31b is provided in the recess 31a to partition the recess 31a into a plurality of sections 301 to 304. As a result, the volume of the target 100 may be reduced in each of the sections 301 to 304. Accordingly, the amount of change in volume when the target 100 changes from liquid to solid may be reduced, and the occurrence of cracks on the surface of the target 100 may be suppressed, so that the occurrence of abnormal discharge caused from the electric field concentration may be suppressed.

When an additive is introduced into a film to be formed on the substrate W, the additive may be introduced into the material of the target 100 in some or all of the sections 301 to 304.

The tray support 32 is fixed to the back surface of the tray 31, and supports the tray 31. The tray support 32 is made of a non-magnetic, electrically conductive, and highly thermally conductive material (e.g., Cu).

The insulator 33 is disposed between the tray support 32 and the heat transfer member 34, and insulates the tray support 32 and the heat transfer member 34 from each other. The insulator 33 is made of an insulator having a satisfactory thermal conductivity, such as AlN or Al$_2$O$_3$. As a result, the tray 31 and the tray support 32 are insulated from the processing chamber 10.

The heat transfer member 34 is thermally connected to the refrigerator 37 via the shaft 36. The heat transfer member 34 is made of a material having a high thermal conductivity (e.g., Cu).

The fastening bolts 35 fix the tray support 32, the insulator 33, and the heat transfer member 34. An insulating member 35a is provided between each fastening bolt 35 and the heat transfer member 34. As a result, the tray support 32 and the heat transfer member 34 are insulated from each other.

The shaft 36 penetrates the bottom wall of the processing chamber 10, and thermally connects the heat transfer member 34 provided inside the processing chamber 10 and the refrigerator 37 provided outside the processing chamber 10. The shaft 36 is made of a material having a high thermal conductivity (e.g., Cu).

The refrigerator 37 cools a liquid or the solid target 100 held in the tray 31 via the shaft 36, the heat transfer member 34, the insulator 33, the tray support 32, and the tray 31. For example, the refrigerator 37 is provided to be able to cool the target 100 to a temperature sufficiently lower than the melting point of the low-melting-point material (e.g., −10° C.).

The power supply 38 is electrically connected to the tray 31 via the tray support 32. The power supply 38 may be a DC power supply when the target 100 is a conductive material, or may be a radio-frequency power supply when the target 100 is a dielectric material. When the power supply 38 is a radio-frequency power supply, the power supply 38 is connected to the tray support 32 via a matcher. When a voltage is applied to the tray 31, a sputtering gas (e.g., Ar gas) is dissociated around the target 100. Then, ions of the dissociated sputtering gas collide with the target 100, and sputtered particles, which are particles of the material of the target 100, are emitted from the target 100.

The magnet 39 is disposed on the back surface of the tray 31. The ions of the dissociated sputtering gas collide with the target 100 by being attracted by a magnetic field 38a of the magnet 39.

The sputtered particle emitting unit 40 includes a target holder 41 that holds a target 200, and a power supply 42.

The target 200 is made of a material containing constituent elements of a film to be formed, and may be a conductive material or a dielectric material. Descriptions will be made herein below assuming that the target 200 is Al.

The target holder 41 is made of a conductive material, and is provided in the chamber main body 10a of the processing chamber 10 via an insulating member (not illustrated). In the example illustrated in FIG. 1, the target holder 41 is provided to be oblique with respect to the rotation axis of the rotation direction 24 of the substrate W.

The power supply 42 is electrically connected to the target holder 41. The power supply 42 may be a DC power supply when the target 200 is a conductive material, or may be a radio-frequency power supply when the target 200 is a dielectric material. When the power supply 42 is a radio-frequency power supply, the power supply 42 is connected to the target holder 41 via a matcher. When a voltage is applied to the target holder 41, the sputtering gas is dissociated around the target 200. Then, ions of the dissociated sputtering gas collide with the target 200, and sputtered particles, which are particles of the material of the target 200, are emitted from the target 200.

The sputtered particle emitting unit 40 may further include a magnet (not illustrated) disposed on the back surface of the target holder 41, and a magnet scanning mechanism (not illustrated) that reciprocates the magnet. By reciprocating the magnet, it is possible to change a position at which the ions collide with the target 200, in other words, a position at which the sputtered particles are emitted. As a result, a biased erosion of the target may be suppressed.

The shielding plate 50 has an opening 51, and is provided to be rotatable in a rotating direction 52 by a shielding plate rotating mechanism (not illustrated). As a result, when the opening 51 of the shielding plate 50 is positioned in the region facing the target 100 (or 200), the target 200 (or 100) is covered with the shielding plate 50. Thus, when a sputtering is being performed in the target 100 (or 200), particles emitted by the sputtering may be prevented from adhering to the target 200 (or 100). Further, by positioning the opening 51 of the shielding plate 50 in a region outside the targets 100 and 200, the targets 100 and 200 are covered with the shielding plate 50.

The control unit 60 is configured with a computer, and controls each component of the substrate processing apparatus 1. The control unit 60 includes a main control unit configured with a CPU that actually performs this control, and an input device, an output device, a display device, and a storage device. The storage device stores parameters of various processes performed by the substrate processing apparatus 1, and is set with a storage medium that stores a program for controlling processes performed by the substrate processing apparatus 1, that is, a process recipe. The main control unit of the control unit 60 retrieves a predetermined process recipe stored in the storage medium, and causes the substrate processing apparatus 1 to execute a predetermined process based on the process recipe.

<Film Forming Process>

Next, an example of a film forming process using the substrate processing apparatus 1 will be described with reference to FIGS. 3A to 3D. FIGS. 3A to 3D are views illustrating an example of the film forming process using the substrate processing apparatus 1. Here, descriptions will be made assuming, for example, a case where an AlN film is formed as an underlying film, and then, a GaN film is formed.

First, the substrate holding unit 20 is caused to hold the substrate W. FIG. 3A is an example of a view illustrating a state where the substrate W is held by the substrate holding unit 20. Specifically, the control unit 60 opens the gate valve 11, and controls a substrate transfer device (not illustrated) to transfer the substrate W into the processing chamber 10 from the carry in/out port provided in the side wall of the processing chamber 10. The control unit 60 moves lifter pins (not illustrated) upward from the substrate holding unit 20 to receive the substrate W held by the substrate transfer device. When the substrate W is transferred to the lifter pins, the control unit 60 causes the substrate transfer device to retreat from the carry in/out port, and closes the gate valve 11. The control unit 60 moves the lifter pins downward to place the substrate W on the substrate holding unit 20. Then, the control unit 60 controls the electrostatic chuck 21, to adsorb the substrate W onto the substrate holding unit 20. As a result, as illustrated in FIG. 3A, the substrate W is held (adsorbed) by the substrate holding unit 20.

The inside of the processing chamber 10 is depressurized to a predetermined vacuum atmosphere by the exhaust device 14. The side wall of the processing chamber 10 is cooled by the cooling mechanism 15. The target 100 is cooled by the refrigerator 37. The opening 51 of the shielding plate 50 is positioned in a region outside the targets 100 and 200.

Next, the substrate holding unit 20 is rotated by 180° in the rotation direction 23, such that the substrate W faces the targets 100 and 200. FIG. 3B is an example of a view illustrating a state where the substrate W faces the targets 100 and 200. Specifically, the control unit 60 controls a reversal driver (not illustrated) to rotate the substrate holding unit 20 in the rotation direction 23, thereby reversing the substrate holding unit 20 upside down.

Next, an AlN film is formed on the substrate W. FIG. 3C is an example of the substrate processing apparatus 1 during the formation of AlN film. Specifically, the control unit 60 controls the shielding plate rotating mechanism (not illustrated) to rotate the shielding plate 50, thereby positioning the opening 51 of the shielding plate 50 in the region facing the target 200. Further, the control unit 60 controls the rotation driver (not illustrated) of the substrate holding unit 20 to rotate the substrate W in the rotation direction 24. The control unit 60 controls the heater 22 to heat the substrate W to 500° C. to 600° C. The control unit 60 controls the gas supply (not illustrated) to introduce Ar gas and $N_2$ gas into the processing space S from the gas introduction port 12. Further, the control unit 60 controls the power supply 42 of the sputtered particle emitting unit 40 to apply a voltage to the target holder 41. The control unit 60 may control the magnet scanning mechanism to reciprocate the magnet provided on the back surface of the target holder 41.

As a result, the Ar gas is dissociated around the target 200, and the dissociated Ar gas collides with the target 200 so that Al sputtered particles are emitted. Thus, the Al sputtered particles adhering to the surface of the substrate W react with the $N_2$ gas introduced from the gas introduction port 12, so that an AlN film is formed.

The target 100 is covered with the shielding plate 50. Thus, a heat transfer from the substrate W to the target 100 due to a thermal radiation may be prevented.

Next, a GaN film is formed on the substrate W. FIG. 3D is an example of the substrate processing apparatus 1 during the formation of GaN film. Specifically, the control unit 60 controls the shielding plate rotating mechanism (not illustrated) to rotate the shielding plate 50, thereby positioning the opening 51 of the shielding plate 50 in the region facing the target 100. Further, the control unit 60 controls the rotation driver (not illustrated) of the substrate holding unit 20 to rotate the substrate W in the rotation direction 24. The control unit 60 controls the heater 22 to heat the substrate W to 500° C. to 600° C. The control unit 60 controls the gas supply (not illustrated) to introduce Ar gas and $N_2$ gas into the processing space S from the gas introduction port 12. Further, the control unit 60 controls the power supply 38 of the sputtered particle emitting unit 30 to apply a voltage to the tray 31 and the tray support 32.

As a result, the Ar gas is dissociated around the target 100, and the dissociated Ar gas collides with the target 100 so that Ga sputtered particles are emitted. Thus, the Ga sputtered particles adhering to the surface of the substrate W react with the $N_2$ gas introduced from the gas introduction port 12, so that a GaN film is formed.

Here, the target 100 is cooled to a temperature (e.g., −10° C.) sufficiently lower than the melting point of Ga (29.6° C.). As a result, the target 100 may be prevented from being liquefied due to the temperature rise caused from the collision of Ar ions during the sputtering. In other words, when the target 100 is liquefied, the emission amount of sputtered particles decreases, so that a film forming rate of the substrate W is reduced. The substrate processing apparatus 1 may prevent the liquefaction of the target 100, thereby preventing the reduction of the film forming rate of the substrate W.

<Target Introducing Process>

Figure 4:
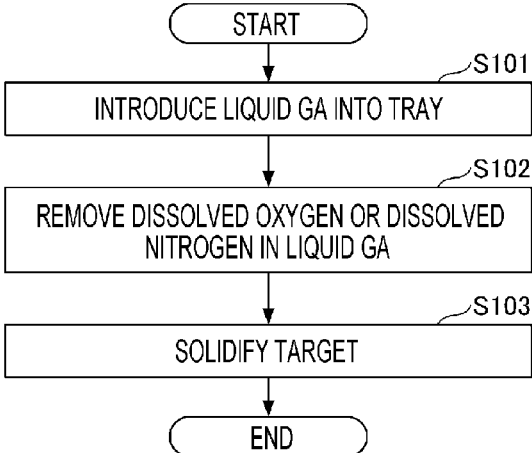
FIG. 4 is a flowchart illustrating an example of a target introducing process in the substrate processing apparatus.

Next, an example of a process of introducing the target 100 will be described with reference to FIG. 4. FIG. 4 is a flowchart illustrating an example of the process of introducing the target 100 in the substrate processing apparatus 1.

In step S101, a liquid Ga is introduced into the tray 31. First, the control unit 60 stops the refrigerator 37, and sets the temperature of the tray 31 to room temperature. Further, the control unit 60 controls the heater (not illustrated) that heats the tray 31, to maintain the temperature of the tray 31 at a temperature at which Ga enters a liquid state (e.g., 30° C. or higher). Further, the control unit 60 rotates the shielding plate 50 to position the opening 51 of the shielding plate 50 in the region facing the recess 31*a* of the tray 31. The control unit 60 controls the shielding plate rotating mechanism to rotate the shielding plate 50, such that the opening 51 of the shielding plate 50 is positioned in the region facing the recess 31*a* of the tray 31. Further, the control unit 60 controls the reversal driver to rotate the substrate holding unit 20 by 90°, thereby forming a working space.

Next, an operator opens the lid 10*b*, and introduces a liquid Ga heated to 30° C. or higher into the recess 31*a* of the tray 31. Then, the operator closes the lid 10*b*.

In step S102, a degassing is performed for a dissolved gas (e.g., dissolved oxygen or dissolved nitrogen) in the liquid Ga. Here, the control unit 60 controls the exhaust device 14 to evacuate the inside of the processing chamber 10. As a result, the dissolved gas (e.g., dissolved oxygen or dissolved nitrogen) in the liquid Ga is removed.

In step S103, the target 100 is solidified. Here, the control unit 60 controls the refrigerator 37 to cool the target 100.

As a result, it is possible to prevent a generation of air bubbles in the solid target 100 formed in the tray 31. Thus, it is possible to prevent the occurrence of abnormal discharge caused from the electric field concentration, when the air bubbles are exposed to the surface of the target 100.

<Erosion Recovering Process>

Here, when the target 100 is sputtered, an erosion occurs on the surface of the target 100, and thus, the surface of the target 100 becomes uneven. When the surface of the target 100 becomes uneven, the sputtered particles directed toward the substrate W decrease, and thus, the film forming rate is reduced. Further, the electric field concentration may occur, which may cause the occurrence of abnormal discharge.

Figure 5:
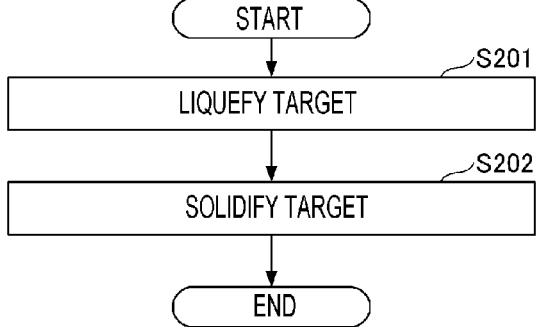
FIG. 5 is a flowchart illustrating an example of a target erosion recovering process in the substrate processing apparatus.

FIG. 5 is a flowchart illustrating an example of a process of recovering an erosion of the target 100 in the substrate processing apparatus 1.

In step S201, the target 100 is liquefied. Here, the control unit 60 stops the refrigerator 37. Further, the control unit 60 controls the heater (not illustrated) that heats the tray 31, to maintain the temperature of the tray 31 at a temperature at which Ga enters a liquid state (e.g., 30° C. or higher). As a result, the target 100 is melted so that the unevenness of the surface of the target 100 is eliminated.

In step S202, the target 100 is solidified. Here, the control unit 60 controls the refrigerator 37 to cool the target 100.

As a result, the unevenness of the surface of the solid target 100 formed in the tray 31 may be eliminated. Further, the reduction of the film forming rate of the substrate W may be prevented. Further, it is possible to prevent the occurrence of abnormal discharge caused from the electric field concentration.

According to an aspect, it is possible to provide a substrate processing apparatus and a substrate processing method which may use a low-melting-point material as a target.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a tray provided in a vacuum processing container and having a recess that accommodates a first target;
a first magnet disposed on a back surface of the tray;

a target holder provided in the vacuum processing container, the target holder configured to hold a second target;
a second magnet disposed on a back surface of the target holder;
a magnet scanner configured to reciprocate the second magnet such that when the second target is determined to be sputtered, a position at which sputtered particles are emitted can be changed by reciprocating the second magnet;
a refrigerator configured to cool the tray via an insulator positioned between the tray and a heat transfer member such that the first target is solidified;
a first heater configured to heat the tray;
a substrate holder configured to hold a substrate;
a reversal driver configured to reverse a position of the substrate holder upside down;
a rotation driver configured to rotate the substrate holder in a circumferential direction of the substrate; and
a shielding plate having an opening,
a controller configured to:
heat the tray, via the first heater, such that a temperature is maintained at which the first target enters a liquid state;
after the first target in a liquid state is introduced into the recess of the tray, evacuate an inside of the vacuum processing container;
cool the first target, via the refrigerator, to a temperature sufficiently lower than a melting point of the first target;
adsorb the substrate onto the substrate holder;
rotate the substrate holder, via the reversal driver, to reverse the substrate holder upside down;
rotate the shielding plate such that the opening is positioned facing the second target
introduce a sputtering gas into the vacuum processing container and apply a voltage to the target holder to sputter the second target;
rotate the shielding plate such that the opening is positioned facing the first target;
introduce the sputtering gas into the vacuum processing container and apply a voltage to the tray to sputter the first target;
wherein the shielding plate is configured to rotate such that when the opening of the shielding plate is positioned facing the first target, the second target is covered by the shielding plate, and when the opening of the shielding plate is positioned facing the second target, the first target is covered by the shielding plate,
wherein the tray is provided to face upward, and the target holder is provided to be oblique with respect to a rotation axis of the substrate holder rotating in the circumferential direction.

2. The substrate processing apparatus according to claim 1, wherein the substrate holder includes an electrostatic chuck that adsorbs the substrate.

3. The substrate processing apparatus according to claim 1, wherein the substrate holder includes a second heater that heats the substrate.

4. The substrate processing apparatus according to claim 1, wherein the recess of the tray is partitioned into a plurality of sections.

5. The substrate processing apparatus according to claim 1, further comprising:
a gas supply configured to supply a gas into the vacuum processing container; and
a power supply configured to apply a voltage to the tray.

6. The substrate processing apparatus according to claim 1, wherein the first target is Ga.

7. The substrate processing apparatus according to claim 2, wherein the substrate holder includes a second heater that heats the substrate.

8. The substrate processing apparatus according to claim 7, wherein the recess of the tray is partitioned into a plurality of sections.

9. The substrate processing apparatus according to claim 8, further comprising:

a gas supply configured to supply a gas into the vacuum processing container; and a power supply configured to apply a voltage to the tray.

10. The substrate processing apparatus according to claim 9, wherein the first target is Ga.

11. A substrate processing method comprising:

providing a substrate processing apparatus including:

a tray provided in a vacuum processing container and having a recess that accommodates a first target, a first magnet disposed on a back surface of the tray;

a target holder provided in the vacuum processing container, the target holder configured to hold a second target, a second magnet disposed on a back surface of the target holder;

a magnet scanner configured to reciprocate the second magnet such that when the second target is determined to be sputtered, a position at which sputtered particles are emitted can be changed by reciprocating the second magnet, a refrigerator configured to cool the tray via an insulator positioned between the tray and a heat transfer member such that the first target is solidified, a substrate holder configured to hold a substrate, a first heater configured to heat the tray, a reversal driver configured to reverse a position of the substrate holder upside down, a rotation driver configured to rotate the substrate holder in a circumferential direction of the substrate, and a shielding plate having an opening, wherein the shielding plate is configured to rotate such that when the opening of the shielding plate is positioned facing the first target, the second target is covered by the shielding plate, and when the opening of the shielding plate is positioned facing the second target, the first target is covered by the shielding plate, wherein the tray is provided to face upward, and the target holder is provided to be holder rotating in the oblique with respect to a rotation axis of the substrate circumferential direction; and forming a film on the substrate by sputtering the first target in a state where the first target is cooled by the refrigerator.

12. The substrate processing method according to claim 11, further comprising:

heating the tray, via the first heater, such that a temperature is maintained at which the first target enters a liquid state;

introducing the first target in a liquid state into the recess of the tray;

evacuating an inside of the vacuum processing container to degas the first target in the liquid state;

cooling the tray to solidify the first target;

adsorbing the substrate onto the substrate holder;

rotating the substrate holder, via the reversal driver, to reverse the substrate holder upside down;

rotating the shielding plate such that the opening is positioned facing the second target;

applying a voltage to the tray such that the first target is sputtered in a solid state;

sputtering the second target;

rotating the shielding plate such that the opening is positioned facing the first target; and sputtering the first target.

13. The substrate processing method according to claim 11, further comprising:

liquefying the first target accommodated in the recess of the tray; and solidifying the first target accommodated in the recess of the tray.

14. The substrate processing apparatus according to claim 1, wherein the controller is further configured to:

after the first target is sputtered, liquefy the first target by stopping the refrigerator and heating the tray via the first heater; and solidify the first target by cooling the first target via the refrigerator.

15. The substrate processing apparatus according to claim 1, wherein the second target is a conductive material or a dielectric material.

* * * * *